(12) United States Patent
Rosca et al.

(10) Patent No.: US 12,360,173 B2
(45) Date of Patent: Jul. 15, 2025

(54) MONITORING OF A CONVERTER

(71) Applicant: Innomotics GmbH, Nuremberg (DE)

(72) Inventors: Cornel-Marian Rosca, Deining (DE); Stefan Kögl, Nuremberg (DE); Fabian Hecht, Lauf (DE)

(73) Assignee: Innomotics GmbH, Nuremberg (DE)

( * ) Notice: Subject to any disclaimer, the term of this patent is extended or adjusted under 35 U.S.C. 154(b) by 0 days.

(21) Appl. No.: 18/031,078

(22) PCT Filed: Oct. 15, 2021

(86) PCT No.: PCT/EP2021/078618
§ 371 (c)(1),
(2) Date: Apr. 10, 2023

(87) PCT Pub. No.: WO2022/079242
PCT Pub. Date: Apr. 21, 2022

(65) Prior Publication Data
US 2023/0305076 A1    Sep. 28, 2023

(30) Foreign Application Priority Data
Oct. 15, 2020   (EP) ..................... 20201982

(51) Int. Cl.
*G01R 31/40*    (2020.01)
*G05B 23/02*    (2006.01)

(52) U.S. Cl.
CPC ......... *G01R 31/40* (2013.01); *G05B 23/0221* (2013.01)

(58) Field of Classification Search
CPC ...................................................... G01R 31/40
See application file for complete search history.

(56) References Cited

U.S. PATENT DOCUMENTS

| | | | |
|---|---|---|---|
| 11,243,263 B2 * | 2/2022 | Wolfe | ............... G06Q 10/06 |
| 2004/0227621 A1 * | 11/2004 | Cope | ............... H04M 11/066 |
| | | | 370/487 |
| 2013/0116877 A1 * | 5/2013 | Sabrie | ............... H01M 16/00 |
| | | | 165/41 |
| 2018/0152338 A1 * | 5/2018 | Panigrahi | ........... H04L 41/0631 |
| 2018/0292467 A1 * | 10/2018 | Rannestad | ............ F03D 17/00 |

(Continued)

FOREIGN PATENT DOCUMENTS

| | | | | |
|---|---|---|---|---|
| AU | 2014201681 A1 * | 4/2014 | ........ | H02J 13/00017 |
| DE | 102011087764 A1 | 6/2013 | | |
| EP | 3787165 A1 | 3/2021 | | |

(Continued)

OTHER PUBLICATIONS

Isermann, Rolf: Title: "Fault-Diagnosis Applications: Model-Based Condition Monitoring: Actuators, Drives, Machinery, Plants, Sensors, and Fault-tolerant Systems"; Jan. 1, 2011 (Jan. 1, 2011); TU Darmstadt; Springer-Verlag, XP055775757; e-ISBN 978-3-642-12767-0.

(Continued)

*Primary Examiner* — Farhana A Hoque
*Assistant Examiner* — Joseph O Nyamogo
(74) *Attorney, Agent, or Firm* — Henry M. Felereisen LLC

(57) ABSTRACT

In a method for monitoring a converter, a plurality of warning messages is used to conclude whether there is a failure in the converter. For this purpose, warning messages are grouped according to the parts of the converter affected.

11 Claims, 8 Drawing Sheets

(56) References Cited

U.S. PATENT DOCUMENTS

2020/0169205 A1\* 5/2020 Kinomura ............... H02M 7/48

FOREIGN PATENT DOCUMENTS

| EP | 3985467 A1 | 4/2022 | | |
|---|---|---|---|---|
| RU | 2707386 C1 | 11/2019 | | |
| UA | 57719 U | 3/2011 | | |
| WO | WO 0225233 A2 | 3/2002 | | |
| WO | WO 2011140559 A1 | 11/2011 | | |
| WO | WO-2016148767 A1 \* | 9/2016 | ............. | B64D 45/00 |

OTHER PUBLICATIONS

PCT International Examination Report and Written Opinion of International Examination Authority mailed May 31, 2022 corresponding to PCT International Application No. PCT/EP2021/078618 filled Oct. 15, 2021.

\* cited by examiner

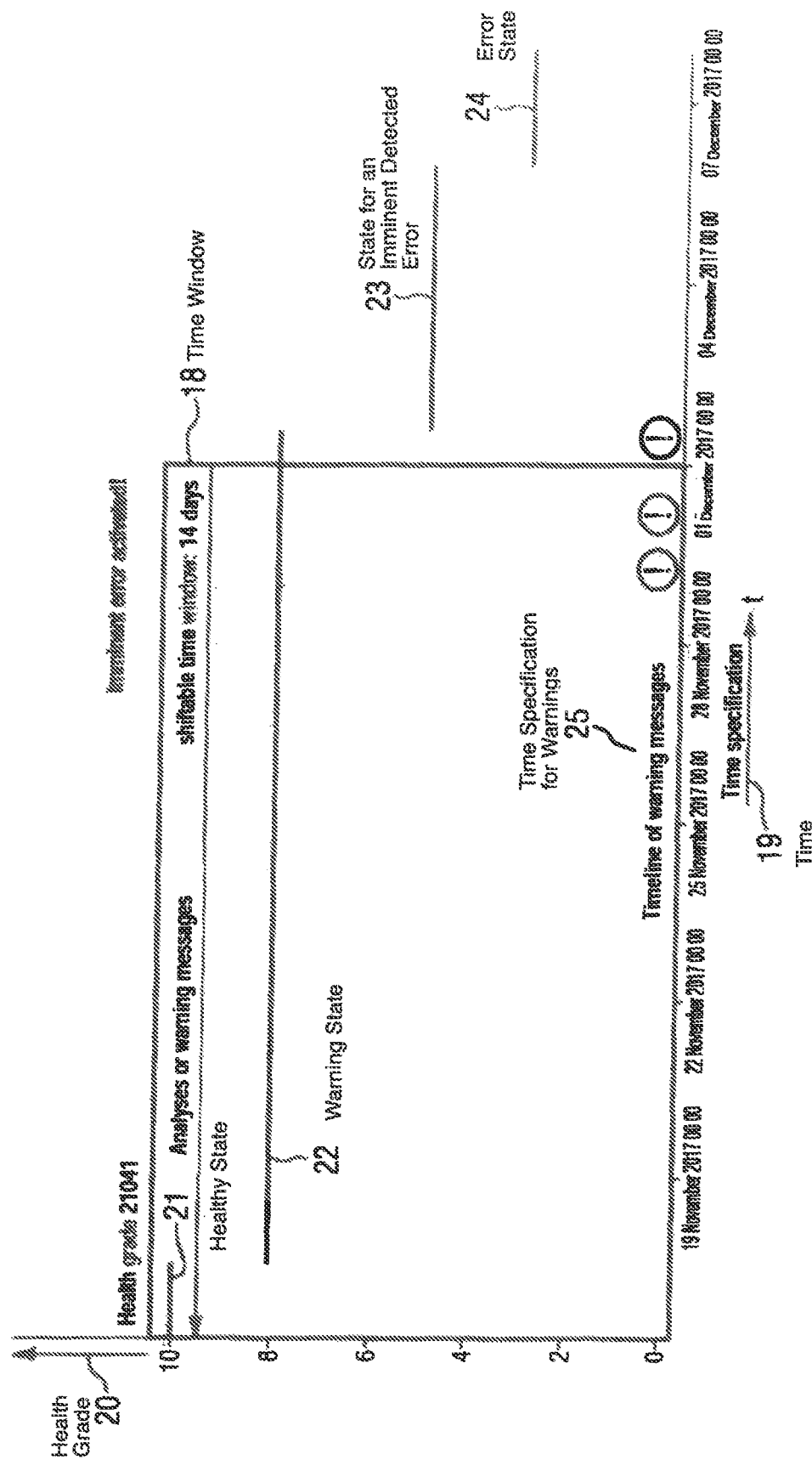

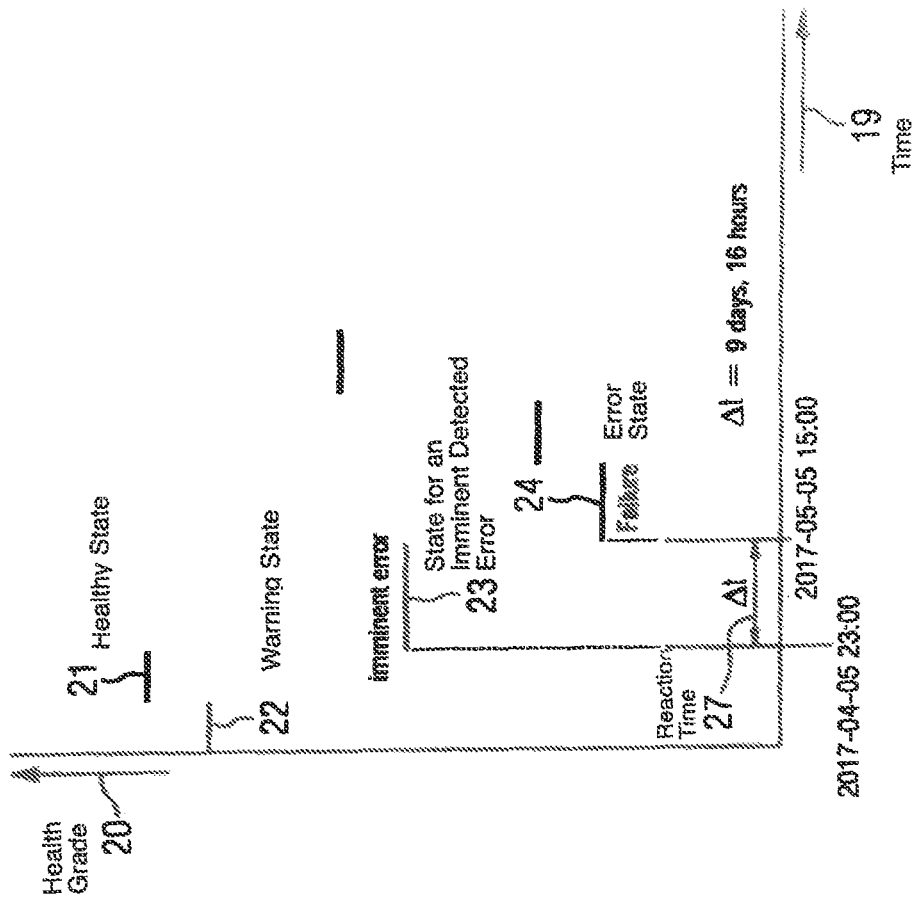

MONITORING OF A CONVERTER

CROSS-REFERENCES TO RELATED APPLICATIONS

This application is the U.S. National Stage of International Application No. PCT/EP2021/078618, filed Oct. 15, 2021, which designated the United States and has been published as International Publication No. WO 2022/079242 A2 and which claims the priority of European Patent Application, Serial No. 20201982.4, filed Oct. 15, 2020, pursuant to 35 U.S.C. 119 (a)-(d).

BACKGROUND OF THE INVENTION

The invention relates to the monitoring of a converter, or the monitoring of a drive, the drive comprising at least one converter, the drive also possibly comprising an electric machine, such as a motor or a generator, in addition to a converter.

By means of a converter, it is possible to realize variable-speed operation of an electric machine, such as, for example, a motor. When the electric machine is used as a generator, a converter can also be used to convert the electric current. In this way, for example, a network supply can be realized. For use in a motor, for example, the mains power with constant frequency and voltage is converted into a power with variable frequency and voltage.

The converter is, for example, an inverter, a rectifier or a power inverter. The converter can be water-cooled and/or air-cooled. The converter is used, for example, in applications with high reliability and quality requirements. Examples of applications for converters are, for example:

- Industrial pumps or fans
- Oil and gas pumps and compressors, e.g. electric submersible pumps and high-speed compressors
- Boiler blowers (suction and pressure ventilation) for power generation
- Clean water and wastewater pumps
- Multiple motor applications and synchronous transfer (e.g. pipelines in the oil and gas industry)
- etc.

These examples of applications relate, in particular, to a use of the converter in which, in particular, high powers are necessary. These are, in particular, powers in the single-digit, double-digit or three-digit megawatt range, Converters which relate to the medium voltage are then preferably used for this purpose. These are referred to as medium voltage converters. A voltage which is greater than or equal to 1000 V can be regarded as a medium voltage. Voltages of 4000 V or 6000 V can also be referred to as a medium voltage. In addition to power semiconductors, the converter has a regulator or controller, for example, a transformer and/or a choke as well. The converter is, for example, a variable-frequency drive (VFD).

If the converter has problems, the problem is detected and documented or stored in a log file. The log file represents a log, the detected and documented problems being log entries. These log entries can be warnings to alert a user to potentially critical events. These log entries can also be errors, i.e. error messages to alert a user to an error or to document this error. Critical events are therefore, for example, also errors, Error messages or warning messages are therefore generated for events. An error message can also be, for example, a fault message. In the event of an error, there is in particular a malfunction. Errors may lead or have led to failure of the converter and/or the drive. Thus, for example, if the drive has problems, detected problems are documented in log entries. These log entries can be warnings—to alert the user to potentially critical events—or errors—to document the errors which led to the failure of the drive.

Warnings which indicate a suboptimal state of the drive are currently sent by the drive or the converter to a UI (user interface) (e.g. accessible via the HMI of the drive or the converter and or via a cloud solution). The warning or warnings are then analyzed by a corresponding drive expert, measures are to be taken and carried out by the expert.

An object of the invention is to improve the monitoring of the converter or the drive.

SUMMARY OF THE INVENTION

The object is achieved according to a method as set forth hereinafter or according to an analysis system as set forth hereinafter. Embodiments result, for example, as claimed in dependent claims.

In a method for monitoring a converter, a plurality of warning messages is used to conclude whether there is an error case in the converter. In addition to a converter, this also relates here and hereinafter to a drive, the drive comprising the converter. In addition to the converter, the drive can also comprise a transmission and/or an electric machine. The conclusion of an error case relates to the prediction of an error case. The prediction of the error case therefore relates to the case that the error has not yet occurred, but according to the prediction will occur with a certain probability. In this case, the error also relates, in particular, to a malfunction of the converter or the drive.

In such a method for monitoring in a converter, for example, log data of the converter are used.

In a method for monitoring a converter, a plurality of warning messages is used to conclude whether there is an error case in the converter, the converter having at least two types of warning messages, a first type of warning message, with warning messages which depend on the type of converter, and a second type of warning message, with warning messages which can be defined by a user, wherein an evaluation of a combination of warnings of the respective first type and of the respective second type is used for monitoring the converter, wherein warning messages of different types are grouped, wherein the grouping of the warning messages corresponds to elements of the converter. A converter can therefore have at least two types of warning, a first type of warning which depends on the type of converter, that is to say, is determined in particular thereby, and a second type of warning, wherein the second type of warning has warnings which can be defined by a user, that is to say, are determined by the user, wherein an evaluation of a combination of errors or warnings of the respective first type and of the respective second type can also be used for event monitoring. The converter can therefore be designed, for example, by a user in such a manner that the user defines individual messages for the converter. An example of a message is an error or warning, that is to say, an error message or a warning message. The individual messages can be used to create an individual event monitor, which depends on the messages individually created by the user. This improves event monitoring and can make it more precise. The messages defined by the user are, for example, stored in a SOP (System Operating Program) or defined there. Such messages defined by the user can be characterized as such when the message is displayed. User-defined messages are based, for example, on signals from I/O interfaces which arise in a system in which the converter is integrated. Signals on which the user-defined messages are based can be, for example, digital signals or analog signals. User-defined messages can be generated, for example, on the basis of a single signal and/or on the basis of a combination of signals, Such signals may, for example, relate to an emergency shutdown, the opening of a door, the dropping of a fuse, an undervoltage, an overvoltage, a fault current, an overcurrent, a fan failure, a failure of a power module of the converter, the bypass of a power module of the converter, an insulation fault, an insulation warning, a communication error, in particular of a power module of the converter, an error or warning for cooling the converter, a precharge of the converter, etc. It can be seen that individually created messages for a converter which is integrated into individual usage (an industrial system) are of importance. These messages created individually by a user can be advantageously used for the event monitoring of the converter in its individual environment, that is to say the industrial system. This improves the quality of the monitoring. The user of the converter is, for example, a person who operates the converter. This operation can be carried out, for example, by an operator of the converter or by a commissioning engineer or the like.

In one embodiment of the method, warning messages, that is to say, warnings can relate, for example, to the following topics: temperature of a heat sink too low, temperature of a heat sink too high, current imbalance, temperature in the converter too high, temperature of the input choke has almost reached the cut-off limit, cabinet heating defective, motor heating defective, motor winding temperature too high, insulation fault, cabinet fan failed, underspeed, motor blocked and/or control voltage, etc. Such warning messages can be created individually in a system-specific manner for a converter. Depending on the system, different requirements can be placed on the converter. For example, the cooling of the inverter can also be system-specific, so that individual warnings for a converter are created in a particular system environment and these are then also combined into groups. In such a group, there may also be at least one warning message which depends on the type of converter. Thus, an individual prediction of possible errors is possible, which is system-specific.

In one embodiment of the method, warning messages of the second type depend on a system in which the converter is integrated. This dependency can, for example, relate to at least one of the following aspects: external cooling of the converter, an external temperature sensor, an external humidity sensor, an external safety sensor such as a door switch, external voltage monitoring for the power supply of controllers, sensors, etc.

In one embodiment of the method, warning messages of the second type depend on a combination of signals. A user can select the combination. The combination relates in particular to Boolean links such as AND, OR, NOT. Examples of signals relate in particular to the following messages: power supply of the power electronics, power supply of the open-loop and/or closed-loop control electronics, door open, door closed, etc. Thus, individual warnings can be designed by a user.

In one embodiment of the method, a failure of the converter can be predicted by an algorithmic analysis of warnings (warning messages). Warnings contain not only quantitatively measurable information, e.g. by threshold warnings, but also qualitative information about the state of the converter or the drive. Algorithms can be used here.

In one embodiment of the method, warning messages are grouped, the grouping of the warning messages corresponding to parts of the converter. For example, the following groups may exist for warnings: transformer, cooling, bypass, power semiconductor, cells, electric machine, transmission and/or bearings. Such groups can be linked to one another with regard to an analysis of the warning messages. Warning messages from different groups may depend on one another.

In one embodiment of the method, the warning messages can be taken from, for example, log data. When considering the warnings, in one embodiment, for example, a specific period of time and/or a period of time after a restart of the converter can be considered. It can thus be achieved, for example, that only relevant warning messages which are related to time are used or considered.

In one embodiment of the method, the warning messages are characterized, that is to say marked in the warning messages, the characterization, that is to say the marking, relating, for example, to a time sequence. The time sequence is obtained, for example, by a time stamp which is linked to a warning message (or vice versa). The characterization, that is to say the marking, of the warning message may, for example, also be a priority of the warning message, the source of the message and/or a name (description) of the warning message or the like.

In one embodiment of the method, the conclusion of an error relates to a prediction of the error case. The conclusion of an error means that on the basis of one or more warning messages, in combination or alone, an error case is expected if no countermeasures are taken. In an advantageous embodiment, the expectation of the error case is also linked to a time specification. The time specification is, for example, information as to when, starting from a certain point in time (for example, the sending of the warning message or the calling of the warning message), the arrival of an error is to be expected, in particular with a certain probability. Thus, for example, it can be determined that with an extension of the waiting time, the probability of the occurrence of an error increases by a certain value.

In one embodiment of the method, at least one rule is used for monitoring, the rule relating to the occurrence of one or more warnings in one or more groups. Thus, for example, the occurrence of one or more specific errors in one or more groups can be linked to one another and analyzed.

In one embodiment of the method, an analysis of the warning messages generates a message for an imminent error case, that is to say in particular for an imminent malfunction. Thus, a user of the converter or the drive can take countermeasures. In one embodiment of the method, such countermeasures are determined by means of an analysis and, in particular, initiated automatically.

In one embodiment of the method, the degree of severity of an imminent error is determined, Depending on the degree of severity, appropriate measures can then be taken. These are, for example, the planning of a rapid repair or the possibly more protracted ordering of a spare part.

In one embodiment of the method, it is possible to convert a plurality of warning messages into a message for an imminent error case. In addition to a timely prediction of an imminent error case, this can also have the advantage, for example, of reducing the number of messages relevant to a user. This improves, in particular, the clarity and the simple handling of the converter or drive. The message for an imminent error case, which can preferably be averted, can be abbreviated, for example, with precog. Thus, this term can be understood as "pre-recognition", for example.

In one embodiment of the method, artificial intelligence is used. It is also possible, according to the method, to train artificial intelligence. Thus, the knowledge of an expert can be replaced by artificial intelligence.

In one embodiment of the method, a message is generated about a temporal occurrence of the error case. For example, it is also possible to analyze the further consequences of the occurrence of the error. Thus, for example, it is possible to analyze whether it is advantageous to react quickly or slowly to warning messages or a message about the imminence of an error (precog). This can be made dependent, for example, on an expected downtime.

Whether it is advantageous to react quickly or slowly is 8. The method as claimed in one of claims 1 to 7, wherein a message about the prevention of the error case is generated.

In one embodiment of the method, warning messages are received via the Internet. Thus, for example, an analysis facility can receive messages from a converter or a drive via the Internet. After the analysis, it is in particular possible for the analysis facility to send data relating to the analysis result to a user interface (UI). The user interface can be supplied with such data, for example, via an Internet connection. The user interface is, for example, at the location of the converter or the drive, in a control room, etc.

In addition to a method, the invention also relates to an analysis facility or an analysis system which has an analysis facility. The analysis facility or the analysis system is designed in particular for carrying out the method. The analysis system may, for example, also be referred to as a prefault system because it predicts potential errors before they occur.

The analysis system of the converter or drive has, in particular, artificial intelligence, the analysis system, in particular, being locally separated from the converter.

In one embodiment of the method or in one embodiment of the analysis system, there is a digital platform for optimizing drive systems, motors, converters, etc., messages or log files being collected and/or transmitted. Thus, data can be transmitted from the converter via the Internet, that is to say via a cloud, to an analysis system. Such data, for example from a logbook (logbook data), is obtained by a digital platform and contains, for example, at least one of the following items of information:

The time stamp of the log event,
The severity of the log event: information, error or warning,
The text of the log event,
The operator of the log event (generator/source of the log event).

A failure of the drive is indicated, for example, by the occurrence of one or more errors after a certain error-free time, which lead to an unplanned standstill of the drive. An error is, in particular, an alarm with the severity "error". A failure of the drive is present, for example, if the drive triggers a standstill due to one or more active errors. Some errors, and thus some failures, can be predicted by the occurrence of specific warnings which occur prior to errors.

The analysis system is designed in particular as a prefault system and analyzes generated warnings with the aid of developed algorithms. The system thus detects potentially occurring errors before they actually occur. In particular, the analysis system takes into account the degree of severity of a warning message in order to make a prediction of the occurrence of an error if a potential failure of the drive could occur.

In one embodiment of the system or the method, the warnings are categorized into a plurality of coherent groups and/or specific decision rules are applied to these groups on the basis of expert knowledge. For example, four prefault groups can be created for warnings:

Input/transformer,
Cells, controller, output,
Cooling
Bypass

These groups are referred to here by way of example. In particular, groups cover critical parts (in particular all critical parts) of the drive, the failure of which can be predicted over a period of at least more than two hours. When specific warnings of particular groups occur with a particular rule, the system issues a positive prediction of a potential drive failure from the identified group with regard to a potentially critical component of the drive.

In one embodiment of the system, the groups are based on a physical relationship of the warnings, it being possible for these warnings to be of different types, as well as in particular on historical or statistical evaluations of the operating history of the respective inverter type. The grouped warnings are therefore related to an error type. A physical relationship results, for example in the group on the topic of cooling, from the fact that relevant alarms (warnings), such as the cooling tank level, the flow rate of the cooling liquid and/or the temperature of the cooling liquid, are combined in this group on the topic of cooling.

In one embodiment of the system, as a prefault system it has specific rules. These are rules on which it depends whether a message (precog) is to be generated for a (potentially) imminent error case. For this purpose, for example, messages are removed from the log history and/or expanded by further findings.

In one embodiment of the analysis system, at least one of the following rules is used:
Rule 1:
At least 1 alarm in each of the groups: group 1, group 2, group 3
Rule 2:
At least 1 alarm in each of the groups: group 1, group 2
Rule 3:
At least 1 alarm in each of the groups: group 2, group 3
Rule 4:
At least 3 alarms in at least one of the groups: group 1, group 2, group 3
Rule 5;
At least 1 alarm in group 4.

In one embodiment of the analysis system, this is designed to report an imminent error case, wherein the analysis system thus represents a prefault system, wherein the analysis system is intended for a message at a specific time or for a certain period of time, wherein, in particular, only warnings of a certain period of time are taken into account in a calculation (e.g. warnings, that is to say warning messages, of the last 14 days (example of a maximum value)). Such temporal parameters can be adaptable to circumstances. The period of time is in particular a characteristic time which has been defined during the development of the converter or the drive. This serves in particular to ensure that only relevant warnings are taken into account by the prefault system. The time stamp of a confirmed warning (confirmation time stamp) must also not be in the past in an embodiment. A confirmation time stamp marks the end of an active phase of the warning. In one embodiment of the analysis system, the confirmation time stamp is to be taken into account in the analysis. In the analysis, it is advantageous to take into account whether warning messages are confirmed without implementing a measure (e.g. repair, exchange, etc.) or whether warning messages are confirmed after a measure has been implemented. For this purpose, a first example can be as follows: Two critical warnings occurred in succession in the last 24 hours. The first warning is part of group 1, and the second warning is part of group 2, The prefault system is activated when the second critical warning has occurred since rule 2 (see above) can be applied here, A second example can be as follows: Two critical warnings occurred in succession in the last 24 hours. Both warnings are part of group 1, The prefauit system is not activated when the second critical message has occurred since no rule can be applied here. If a further message from group 1 arrives thereafter, then a message regarding an imminent error is generated since rule 4 (see above) can be applied.

By means of the analysis system, it is possible to analyze all warnings during production, that is to say in particular during the operation of the drive, in real time without in-depth technical knowledge. As constant manual analysis is very time-consuming, it was not usually carried out in a sufficient manner in the production plant. The method automatically provides a prediction for potentially critical situations before they occur in order to prevent failure. Therefore, the potential downtime of the drives, for example within a production facility, can be reduced by scalability across all drives connected to the analysis facility. As a result, for example, at least one of the following functions can be enabled:

It is possible to inform oneself about a possible drive failure in the near future, It is possible to inform oneself about why a possible drive failure could occur in the near future, It is possible to create recommendations and explanations in order to prevent the failure of the drive.

In one embodiment of the analysis system, it is possible to implement a cloud analysis approach with the analysis facility since the log file data is saved in the cloud by the drive. As a result, the prefault system is provided for scalable cloud instances in a suitable Python environment. These technical features enable process automation. The method is implemented by algorithms which are based on expert knowledge.

In one embodiment of the method, the logs of the drive are analyzed by algorithms based on expert knowledge (with corresponding characterization), the log warnings are classified into various coherent groups and specific decision rules are applied to this classification, which also take into account the occurrence and recognition/confirmation of these warnings.

BRIEF DESCRIPTION OF THE DRAWING

The features of the individual objects claimed or described can readily be combined with one another, Hereinafter, the invention is illustrated and explained in more detail by way of example with reference to the figures. The features shown in the figures can be combined by a person skilled in the art to form new embodiments without departing from the scope of the invention. Elements of the same type are given the same reference character. It is shown in:

DETAILED DESCRIPTION OF PREFERRED EMBODIMENTS

Figure 1:
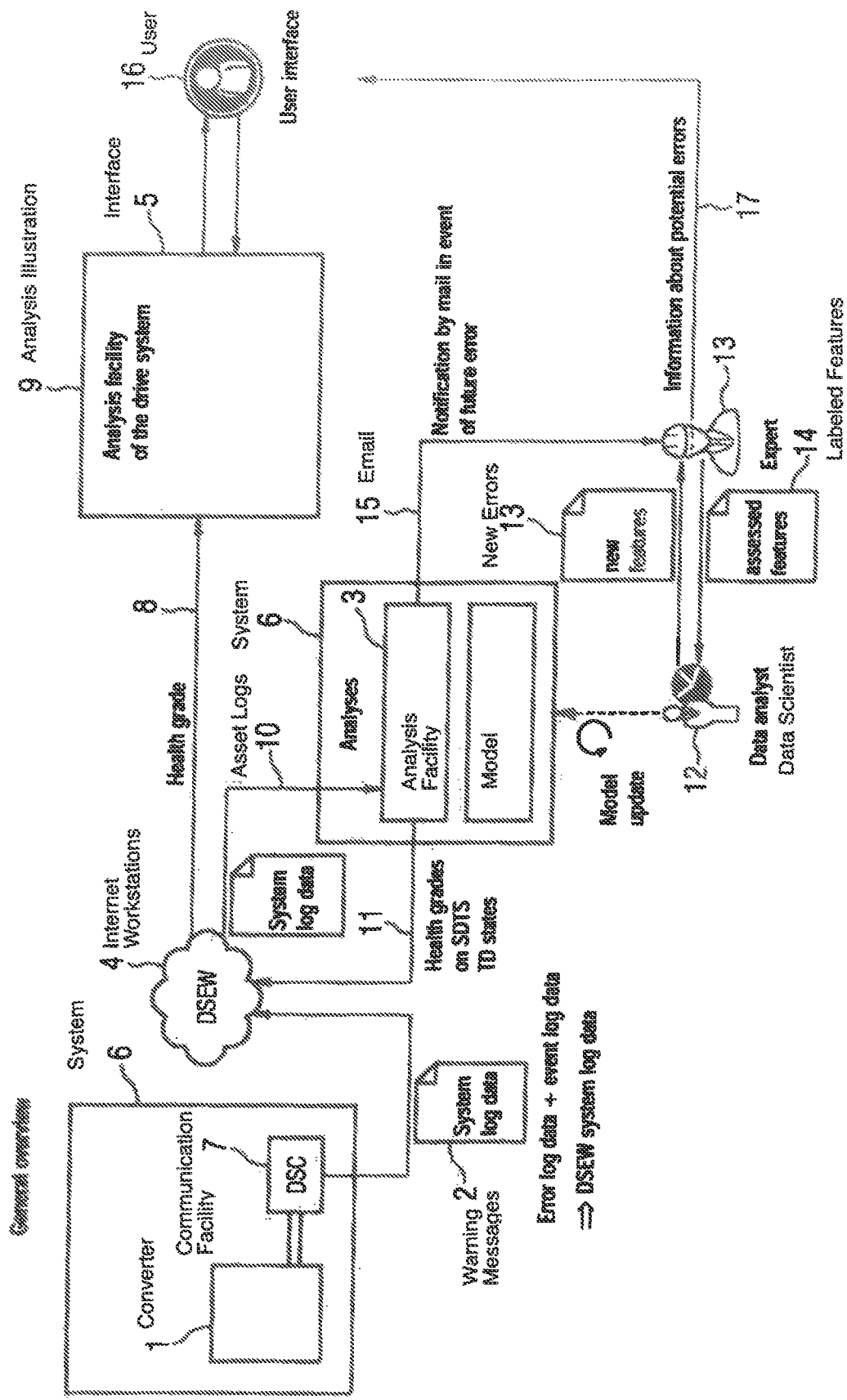
FIG. 1 an overview of the monitoring method,
FIG. 2 a time window for messages,
FIG. 3 a confusion matrix,
FIG. 4 a reaction time analysis,
FIG. 5 statistics,
FIG. 6 a flow chart,
FIG. 7 a first rule illustration,
FIG. 8 a second rule illustration, and
FIG. 9 a third rule illustration.

The illustration according to FIG. 1 shows an overview of a monitoring method. A converter 1 is monitored. The converter 1 is part of a system 6. The system 6 also has a communication facility 7 (DSC: Drive System Connect), which enables the communication of the converter 1. Messages such as warning messages (warnings) 2 can thus be sent to log files. Such messages relate, for example, to errors or general events. Such messages are sent via the Internet 4. For example, a workstation (DSEW: Drive System Expert Workstation) can be provided for this purpose. From this, information about the health grade 8 can be sent to an interface 5 for an analysis illustration 9 of the drive. Asset logs 10 are also sent to an analysis system 6, the analysis system 6 having an analysis facility 3. The analysis facility 3 is provided with artificial intelligence, for example. The analysis facility 3 determines a health grade of the system 6 or one of its components, such as the drive 1, and sends this health grade 11 to the workstations 4 on the Internet. A model is located in the analysis system 6. This model can be improved by means of a data scientist 12, that is to say updated. The data scientist 12 can give new errors 13 to an expert 13. The expert 13 can return labeled failures 14. The expert 13 receives an email 15, for example, when a future error (prefault) 15 has been determined. In this way, the expert 13 can also transmit information about potential errors 17 to a user 16 via a user interface (UI).

The illustration according to FIG. 2 shows a time window 18, a health grade 20 being plotted over time 19. There is a healthy state 21, a warning state 22, a state for an imminent detected error (prefault or precog) 23 and an error state 24. The health grade is also reduced in this order. The time window 18 can be guided over these states, a time specification 25 for warnings being produced as a function of the states.

The illustration according to FIG. 3 shows a confusion matrix 26. This shows how a prediction can be labeled, that is to say designated, with the inclusion of a true event.

The illustration according to FIG. 4 shows the determination of a reaction time 27 until the occurrence of an error 24.

Figure 5:
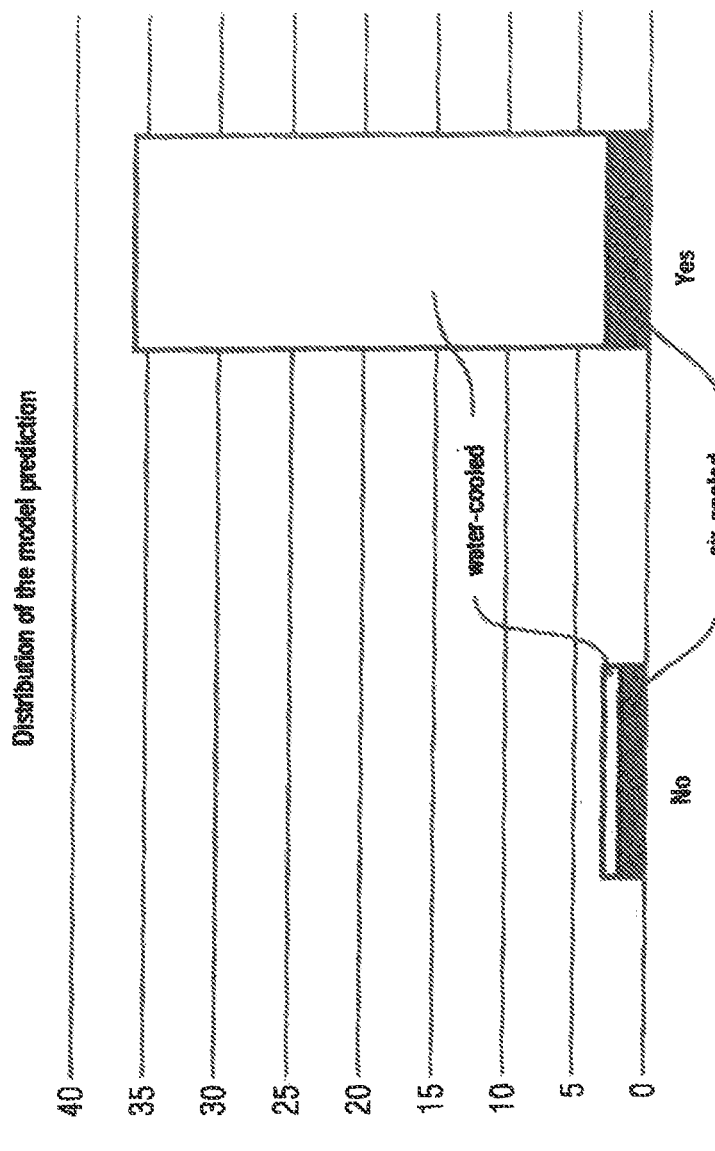

The illustration according to FIG. 5 shows the statistical prediction accuracy of a model for predictable errors. This shows the distribution of the model prediction for air cooling and water cooling.

Figure 6:
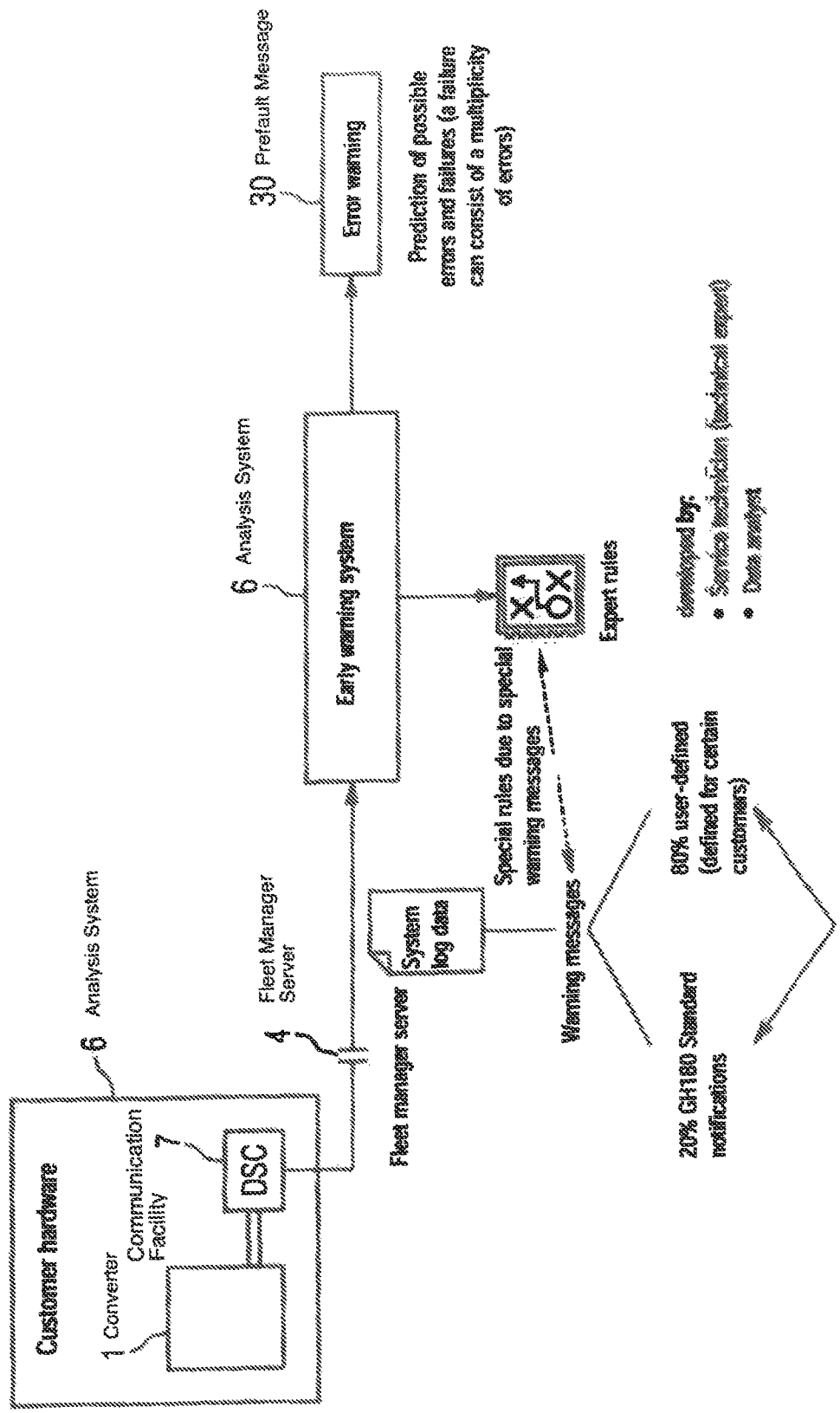

The illustration according to FIG. 6 shows a flow chart similar to FIG. 1. Data (asset logs) of the converter 1 is routed to the analysis system 6 via a fleet manager server 4, which represents the Internet. The analysis system 6 performs the determination of the early detection of an error and can therefore also be referred to as a prefault system. The analysis system 6 outputs a corresponding prefault message (prefault) 30.

Figure 7:
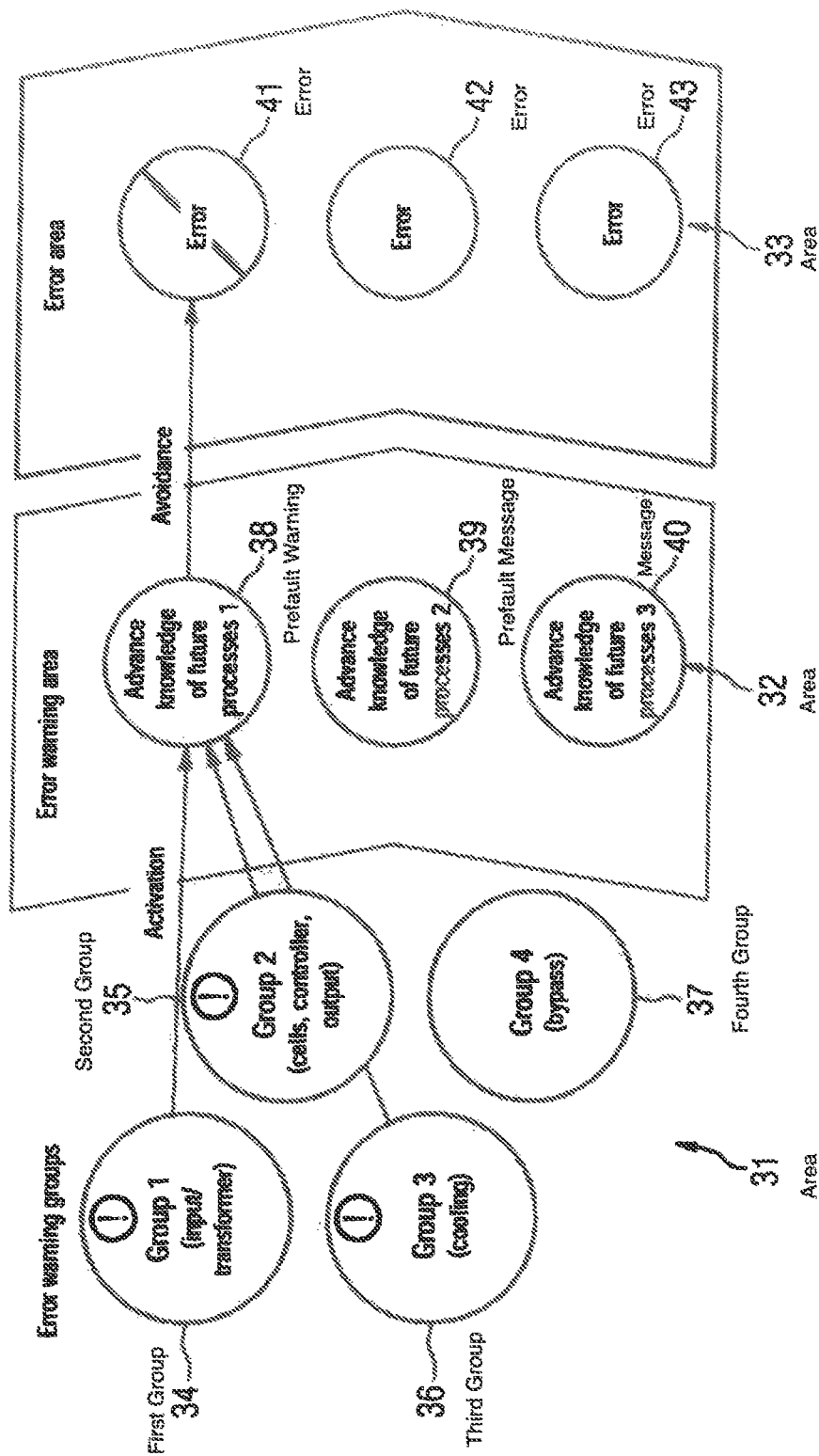
Figure 8:
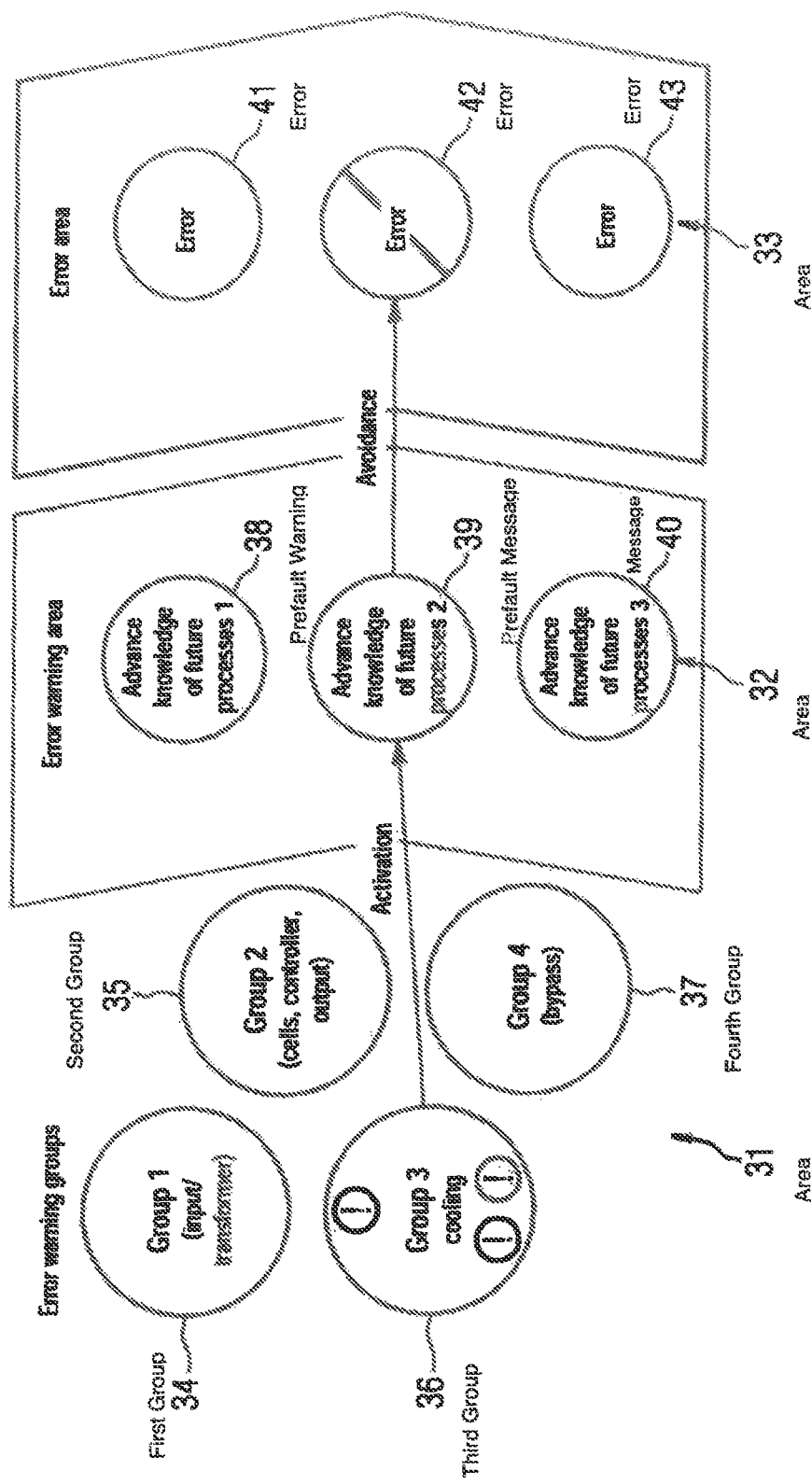
Figure 9:
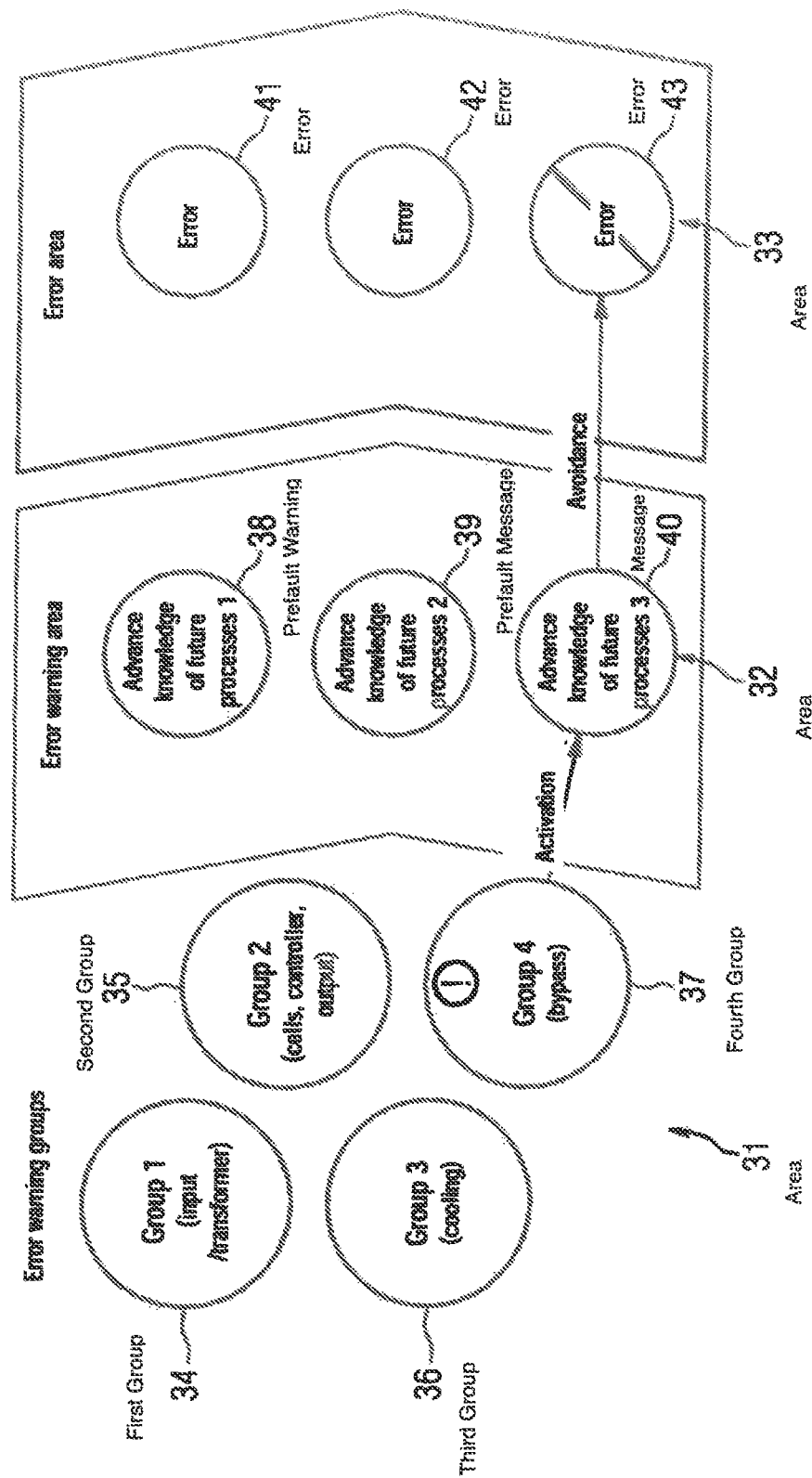

The illustrations according to FIGS. 7, 8 and 9 show various rule illustrations. FIG. 7 shows a first rule. FIG. 8 shows a second rule. FIG. 9 shows a third rule. Areas 31, 32 and 33 for the various events are formed in each case. The area 31 relates to groups 34, 35, 36 and 37 in which warnings are grouped. In the first group 34, warnings relating to input and transformers are grouped. In the second group 35, messages relating to cells of the converter, the regulator and the outputs are grouped. In the third group 36, messages are grouped into warnings relating to cooling. In the fourth group 37, messages are grouped into warnings relating to a bypass of power semiconductors in the converter. According to the first rule, at least one warning must be present in groups 35, 35 and 36 in order to activate, i.e. trigger, a prefault warning (precog 1) 38. Thus, an error 41 can be prevented. As the illustrations in FIGS. 7, 8 and 9 show, there are three different messages 38, 39 and 40 in the area 32 for warnings of an imminent error (precog 2 and 3). In the area 33 for errors, there are three different errors 41, 42 and 43 as are to be predicted or which are to be prevented. The illustration according to FIG. 8 shows a second rule according to which at least three warnings must be present in the third group 36 in order to activate the prefault message (precog 2) 39, in order to be able to predict or prevent the error 42. The illustration according to FIG. 9 shows a third rule according to which at least one warning must be present in the fourth group 37 in order to activate the prefault message (precog 3) 40 in order to be able to predict or prevent the error 43.

The invention claimed is:

1. A method for monitoring a converter, the method comprising:
   operating the converter;
   generating individual warning messages related to the operation of the converter, the converter having at least two types of warning messages, with a first type of the at least two types of warning messages depending on a type of the converter, and with a second type of the at least two types of warning messages defined by a user and specific for event-monitoring in an operating environment of the converter;
   grouping the individual warning messages of the first and second types into a plurality of different groups in correspondence with parts of the converter related to an error type of the converter, wherein the parts of the converter comprise an input a transformer cells, a controller an output cooling, a bypass, and a power module, and the individual warning messages are grouped into a first group with warning messages related to the input and transformer of the converter a second group with warning messages related to the cells, controller and output of the converter a third group related to the cooling of the converter, and a fourth group related to the bypass of the power module in the converter;
   applying a plurality of different rules to the plurality of different groups, with each of the plurality of different rules relating to an occurrence of one or more warning messages in one or more of the plurality of different groups, wherein the plurality of different rules comprises a first rule in which at least one individual warning message is present in each of the first group, the second group, and the third group; a second rule in which at least one individual warning message is present in each of the first group and the second group; a third rule in which at least one individual warning message is present in each of the second and third groups; a fourth rule in which at least three individual warning messages are present in at least one of the first group, the second group, and the third group; and a fifth rule in which at least one individual warning message is present in the fourth group;
   activating a prefault warning to predict an imminent error case according to one of the applied plurality of different rules when the one rule can be applied due to an occurrence of the one or more warning messages in the one or more groups;
   concluding an error case in the converter related to the prediction of the imminent error case based on the activated prefault warning;
   generating a message about prevention of the error case; and
   taking countermeasures to prevent the error case.

2. The method of claim 1, wherein the second type of warning messages depend on a system in which the converter is integrated.

3. The method of claim 1, further comprising marking the at least two types of warning messages in accordance with a time sequence.

4. The method of claim 1, further comprising using and/or training artificial intelligence to monitor the converter.

5. The method of claim 1, further comprising generating a message about a temporal occurrence of the predicted imminent error case.

6. The method of claim 1, further comprising:
   receiving warning messages from an analysis facility via the Internet; and
   sending an analysis result to a user interface.

7. The method of claim 1, further comprising operably connecting the converter with an analysis system which is physically separated from the converter and configured to monitor the converter.

8. The method of claim 7, wherein the analysis system includes artificial intelligence.

9. The method of claim 7, further comprising transmitting data from the converter to the analysis system, wherein the data comprises at least one of data from a log event, a time stamp of the log event, a severity of the log event, a text of the log event, and a source of the log event.

10. An analysis system for a converter, said analysis system being physically separated from the converter, the analysis system comprising:
    an analysis facility configured to monitor the converter by performing the method as set forth in claim 1.

11. The analysis system of claim 10, further comprising artificial intelligence.

* * * * *